(12) United States Patent
Terashima

(10) Patent No.: US 6,515,349 B2
(45) Date of Patent: Feb. 4, 2003

(54) SEMICONDUCTOR DEVICE AND PROCESS FOR THE SAME

(75) Inventor: Tomohide Terashima, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/799,577

(22) Filed: Mar. 7, 2001

(65) Prior Publication Data

US 2002/0053719 A1 May 9, 2002

(30) Foreign Application Priority Data

Sep. 18, 2000 (JP) .................................. 2000-281238

(51) Int. Cl.⁷ ..................... H01L 33/00; H01L 29/76
(52) U.S. Cl. ....................................... 257/630
(58) Field of Search ............................ 257/630

(56) References Cited

U.S. PATENT DOCUMENTS

| | | | | |
|---|---|---|---|---|
| 4,954,868 A | * | 9/1990 | Bergmann et al. | |
| 5,648,671 A | * | 7/1997 | Merchant | |
| 6,054,752 A | * | 4/2000 | Hara et al. | |
| 6,064,086 A | * | 5/2000 | Nakagawa et al. | |
| 6,221,737 B1 | * | 4/2001 | Letavic et al. | |

* cited by examiner

*Primary Examiner*—Stephen D. Meier
(74) *Attorney, Agent, or Firm*—McDermott, Will & Emery

(57) ABSTRACT

The main purpose is to provide a semiconductor device which has a field plate wherein the electric field concentration at a step part can be eliminated and a higher withstanding voltage can be gained.

A field plate is provided on a substrate. The field plate has a step part which bends toward the downward direction from the surface of the substrate.

9 Claims, 7 Drawing Sheets

ELECTRIC FLUX

SEMICONDUCTOR DEVICE AND PROCESS FOR THE SAME

BACKGROUND OF THE INVENTION

1. Field of the Invention

The present invention relates, in general, to a semiconductor device and, in particular, to a double diffused MOS (DMOS) transistor which is built in a discrete element or an IC. This invention also relates to a process for such a semiconductor device.

2. Description of the Background Art

FIG. 8 is a cross section view of a conventional DMOS transistor.

Referring to FIG. 8, an n⁻ epitaxial layer 2 is formed on an n⁺ substrate 1. P diffusion regions 3 are provided in the surface of the n⁻ epitaxial layer 2. N⁺ diffusion regions 4 are formed inside of the p diffusion regions 3 and in the outer periphery part of the element. A gate oxide film 5 is formed on the n⁻ epitaxial layer 2 and a polysilicon gate electrode 6 is formed on the gate oxide film 5. A field oxide film 7 is formed on the surface of the n⁻ epitaxial layer 2. A gate electrode is also formed on the field oxide film 7 and this operates as a field plate. In the following this is referred to as a field plate 6f. A source electrode 8 is formed so as to contact the p diffusion regions 3 and n⁺ diffusion regions 4. A channel stopper electrode 9 is formed so as to contact the outer periphery part n⁺ diffusion region 4. A drain electrode 10 is formed so as to contact the back surface of the n⁺ substrate 1. The reference numeral 11 denotes the edge of the depletion layer in the case that where a bias is applied.

The field plate 6f mitigates the electric field concentration on the edge part of the p diffusion regions 3. By terminating the polysilicon edge part with the upper part of the field oxide film 7, the electric field concentration of the gate edge part is formed inside of the field oxide film 7 so as to increase the withstanding voltage.

In the structure of the above described conventional DMOS transistor, however, referring to FIG. 9, a problem arises that an electric field concentration exists at the edge part of the field oxide film 7 and by an avalanche in this part the entire withstanding voltage is limited. This operation is described in further detail using FIG. 10.

An electric flux at the time of bias application generates a bending as shown in equation (1) at the interface due to the relationship of dielectric constants of $SiO_2$ and Si and, then, terminates, perpendicularly, at the field plate 6f.

$$\tan \theta_1/\epsilon_1 = \tan \theta_2/\epsilon_2 \quad (1)$$

wherein specific dielectric constant of Si is denoted as $\epsilon_1$ while specific dielectric constant of $SiO_2$ is denoted as $\epsilon_2$, and, here, $\epsilon_1$ is approximately 3 times as large as $\epsilon_2$ and $\theta_1$ becomes larger, accordingly.

Because of these relationships the electric flux on the Si bends in the left direction and a electric field concentration occurs at the edge part of the field oxide film 7.

SUMMARY OF THE INVENTION

Therefore, the purpose of this invention is to provide a semiconductor device which has a field plate structure where such an electric field concentration does not occur.

Another purpose of this invention is to provide a process for such a semiconductor device.

A semiconductor device according to the first aspect of this invention includes a substrate. A field plate is provided on the above substrate. The above field plate has a step part which bends from the surface of the above substrate toward the downward direction.

According to this invention, since the above field plate has the step part which bends from the surface of the above substrate toward the downward direction, the electric field concentration at the step part is eliminated.

In accordance with a semiconductor device according to the second aspect of this invention, an indented part, of which the side walls are sloped, is provided on the surface of the above substrate. An oxide flim, of which part of the edge is a downward slope, is provided on the above indented part. The above step part of the above field plate is provided so as to cover the above slope of the above oxide film. The above field plate bends toward the downward direction at the above step part with a bending angle $\phi$ which satisfies the following inequality.

$$\tan \phi \geq x(1-\alpha)/(1+\alpha x^2)$$

In the above equation $x = \tan \theta_1$, $\alpha$ = specific dielectric constant of the above described oxide film/specific dielectric constant of the above described substrate, and $\theta_1$ is an angle formed of the above described slope of the above described indented part and the above described substrate surface.

In a semiconductor device according to the third aspect of this invention, the above described substrate is an Si substrate while the above described oxide film is $SiO_2$.

A semiconductor device according to the fourth aspect of this invention includes a substrate of which part of the surface is indented. An oxide film is provided in the above indented part of the surface of the above substrate. A first field plate is provided on the above substrate. A second field plate, which has a part extending in the horizontal direction, is provided on the above oxide film. When the distance, in the horizontal direction, between the above first field plate and the above part extending in the horizontal direction of the above second field plate is assumed to be 1, the depth of the bottom of the above oxide film from the surface of the above substrate is assumed to be x and the depth of the bottom of the above second field plate from the surface of the above substrate is assumed to be y, the following inequality is achieved.

$$y \geq x(1-\alpha)/(1+\alpha x^2)$$

In the above expression, $\alpha$ = specific dielectric constant of the above oxide film/specific dielectric constant of the above substrate.

In a semiconductor device according to the fifth aspect of this invention, the above substrate is formed of Si while the above oxide film is formed of $SiO_2$.

In accordance with a semiconductor device according to the sixth aspect of this invention, another part of the above second field plate is overlapped on the above first field plate by interposing an interlayer insulating film.

In a semiconductor device according to the seventh aspect of this invention, the above first field plate and the above second field plate are integrated.

In a process for a semiconductor device according to the eighth aspect of this invention, a field oxide film is formed on the surface of the substrate through a LOCOS method (first step). Part of the edge part of the above field oxide film is shaved off so that part of the surface of the above substrate is exposed (second step). A part of the surface of the above substrate which is exposed in the above second step is oxidized again (third step). A field plate is formed on the above substrate so as to cover the part oxidized again of the above field oxide film (fourth step).

In a process for a semiconductor device according to the ninth aspect of this invention, the above process is applied in a process for a double diffused MOS transistor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
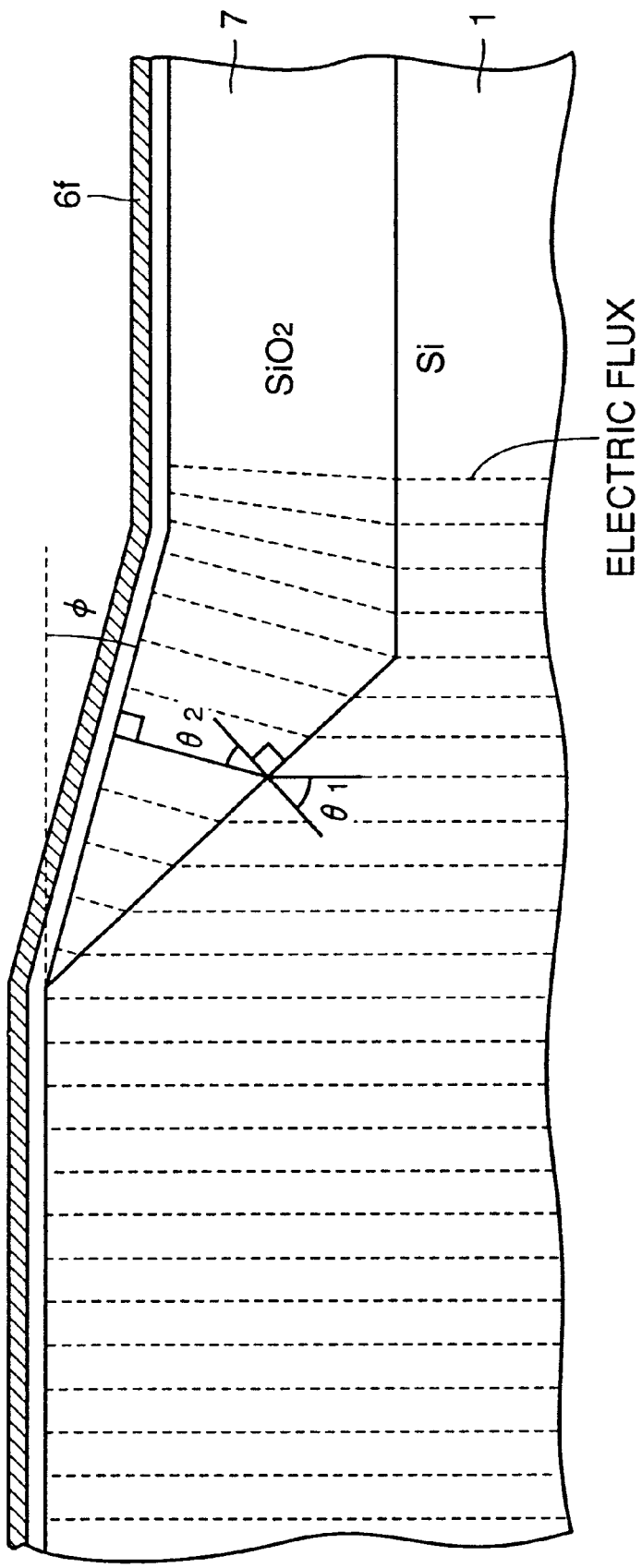
FIG. 1 is a cross section view of a field plate part of a semiconductor device according to a first embodiment.

In the following, the embodiments of this invention are described referring to the drawings.

First Embodiment

Figure 8:
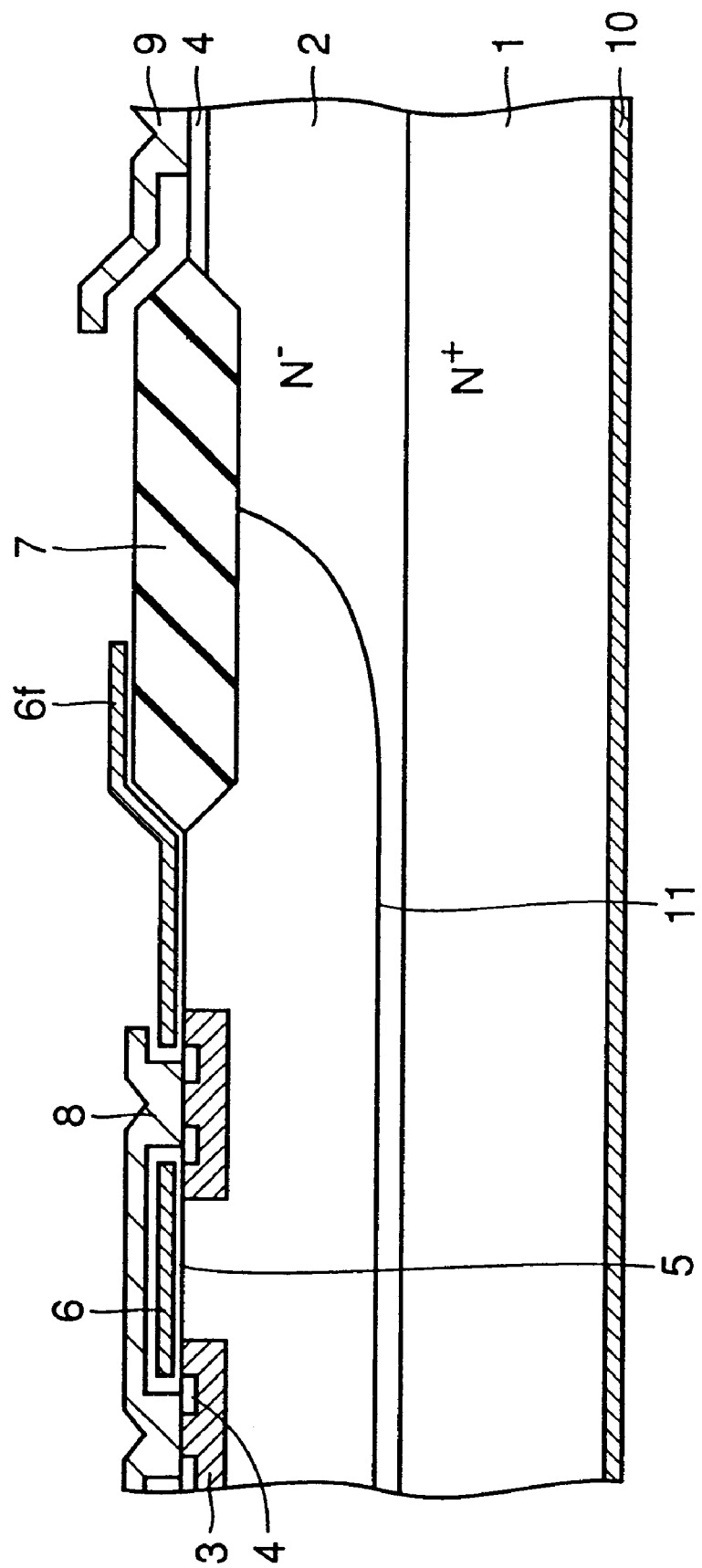
FIG. 8 is a cross section view of a semiconductor device according to a prior art.
Figure 9:
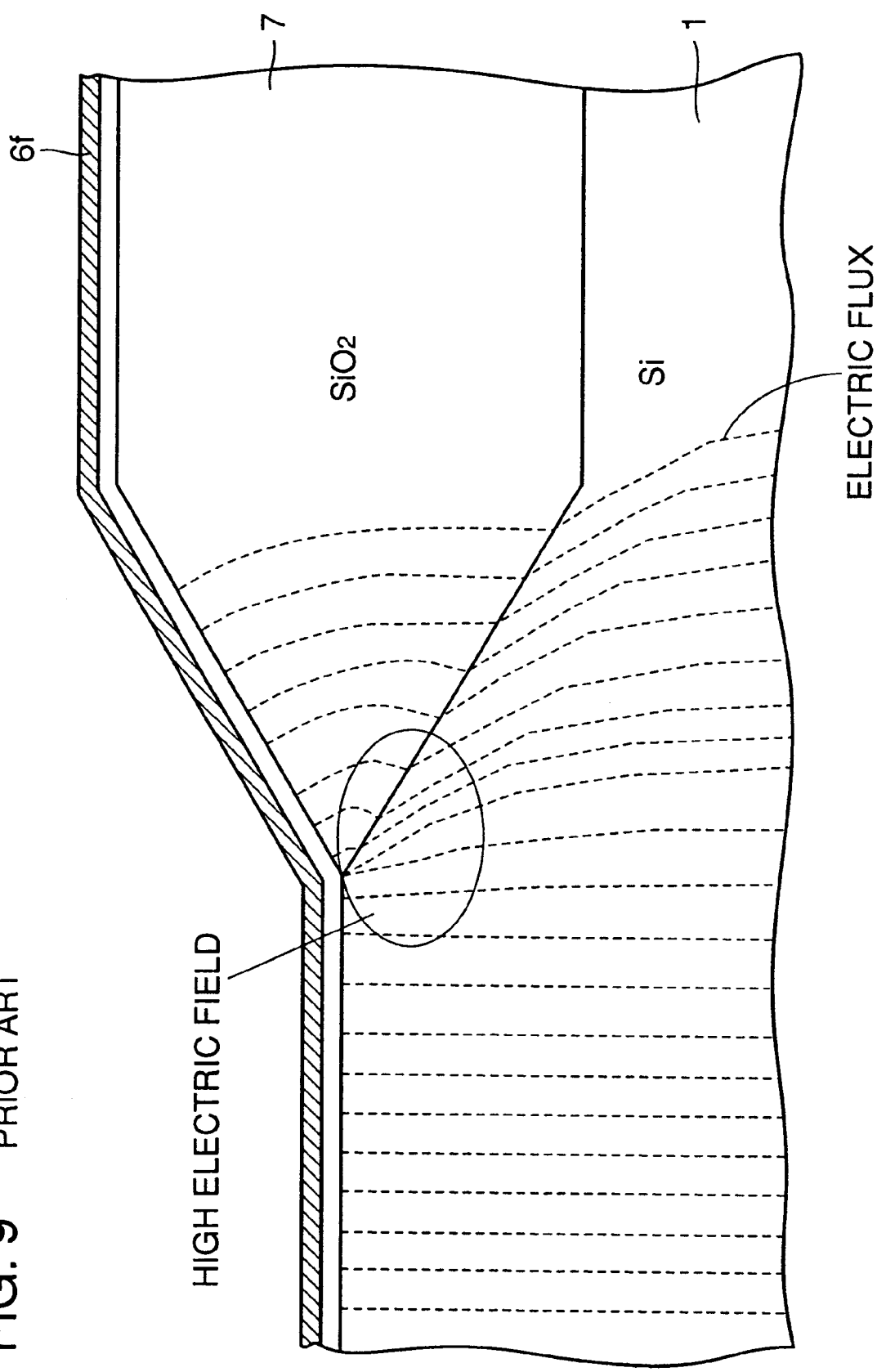
FIG. 9 is a view for explaining a problem of a semiconductor device according to a prior art.
Figure 10:
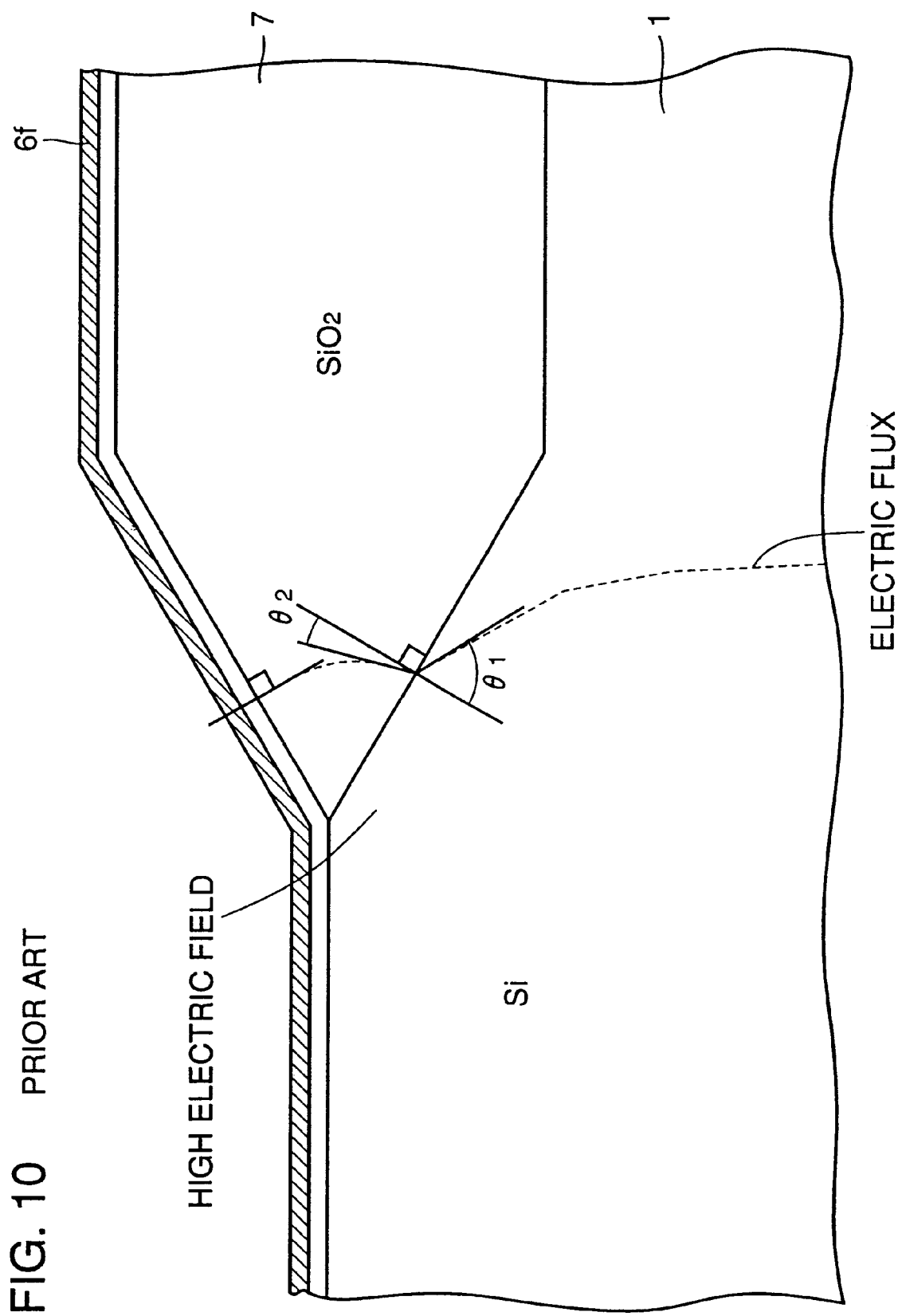
FIG. 10 is a view for explaining further, in detail, the problem of a semiconductor device according to a prior art.

FIG. 1 shows a field plate of a DMOS transistor according to this embodiment. The structure, other than the parts shown, is the same as that in a prior art as shown in FIG. 8. That is to say, referring to FIGS. 1 and 8, an n$^-$ epitaxial layer 2 is formed on an n$^+$ substrate 1. A p diffusion region 3 is provided in the surface of the n$^-$ epitaxial layer 2. N$^+$ diffusion regions 4 are formed inside of the p diffusion region 3 and in the outer peripheral part of the element. A gate oxide film 5 is formed on the n$^-$ epitaxial layer 2 and a poly-silicon gate electrode 6 is formed on the gate oxide film 5. A field oxide film 7 in formed on the surface of the n$^-$ epitaxial layer 2. A field plate 6$f$ is formed on the field oxide film 7. A source electrode 8 is formed so as to contact the p diffusion region 3 and the n$^+$ diffusion regions 4. A channel stopper electrode 9 is formed so as to contact the n$^+$ diffusion region 4 in the outer peripheral part. A drain electrode 10 is formed so as to contact the back surface of the n$^+$ substrate 1.

In the present embodiment, the form of the field plate 6$f$ is designed so that the electric flux is formed so as to be directed approximately straight to the surface. The first factor for gaining such an effect is the inclination of the surface of the field oxide film 7 in the decline direction from the horizontal surface ($\phi \geq 0°$). This can be gained from the relationship of dielectric constants and the condition that the electric field terminates perpendicular to the field plate (6$f$) surface. Further detailed examination show that the following relationships are found in the case that the electric flux is perpendicularly formed.

$$\phi = \theta1 - \theta2$$

tan $\phi$=tan($\theta1-\theta2$) and, therefore, tan $\phi$=(tan $\theta1$−tan $\theta2$)/(1+tan $\theta1$ tan $\theta2$)

here x=tan $\theta1$ and $\alpha=\epsilon2/\epsilon1$ and, therefore, $$\tan \phi = x(1-\alpha)/(1+\alpha x^2)$$

$$d(\tan \phi)/dx = (1-\alpha)(1-\alpha x^2)/(1+\alpha x^2)(1+\alpha x^2)$$

Accordingly, the maximum value is gained when x=1/$\sqrt{\alpha}$ $$\tan \phi = (1-\alpha)/2/\sqrt{\alpha}$$

In the case that $\alpha=1/3$ judging from the ratio of dielectric constants of SiO$_2$ to Si, tan $\phi$ exhibits the maximum value when $\theta1=60°$ and $\phi=30°$ In the case that the value of $\phi$ is taken larger than the $\phi$ gained from the expression with respect to the given $\theta1$, the electric field relaxation effect, of course, becomes larger at the LOCOS edge parts.

In the case that the electric field relaxation in places other than the LOCOS edge parts can be compensated by the thickness of the field oxide film, the value may be set at the value given in the expression in order to gain the withstanding voltage improvement effect and the condition thereof is as follows:

$$\tan \phi \geq x(1-\alpha)/(1+\alpha x^2)$$

The present expression is of course applicable to a substance other than Si or SiO$_2$ and $\alpha$ may be used according to the substance.

In addition, this relationship can be utilized at each step part with respect to a field plate of two steps or more.

In the same way, in the case that $\alpha=1/3$ is applied, $$\tan \phi \geq 2x/(3+x^2)$$

Second Embodiment

Figure 2:
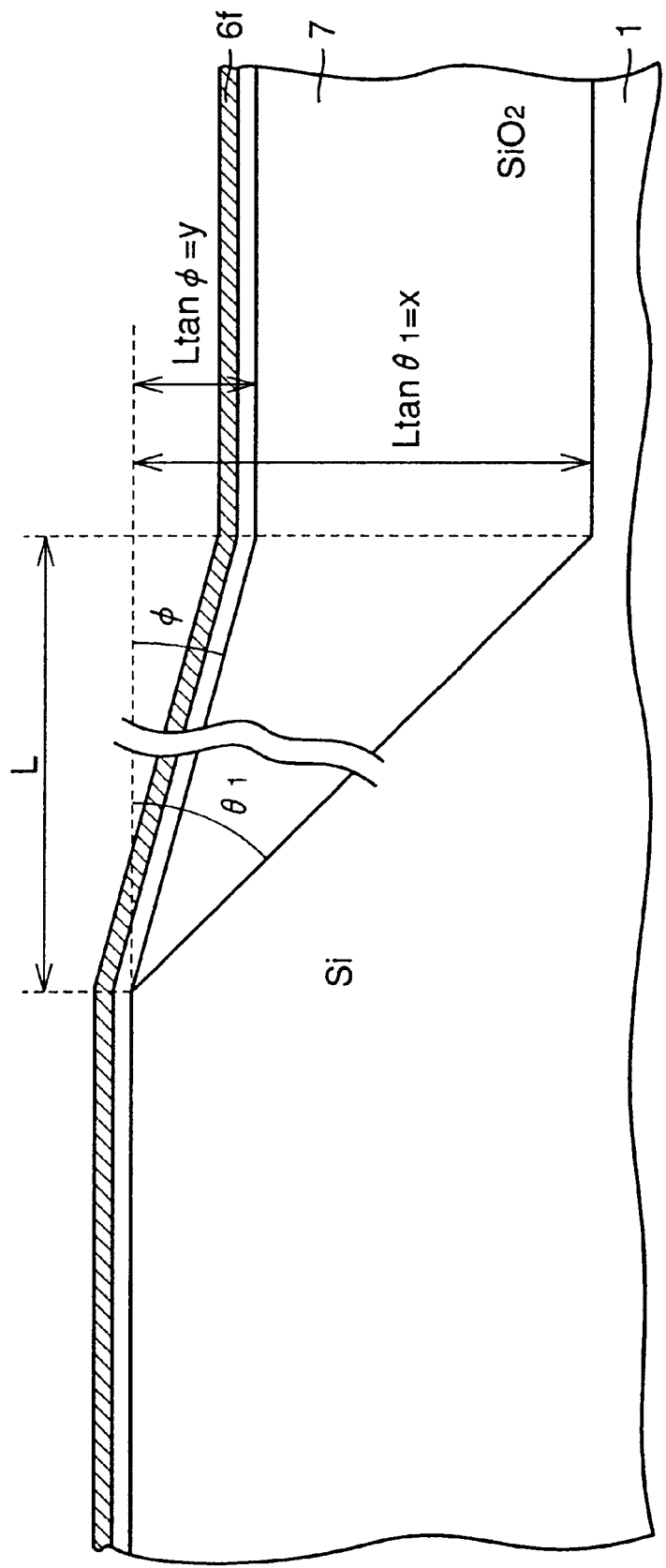
FIG. 2 is a conceptual view of a field plate part of a semiconductor device according to a second embodiment.

A field plate of a DMOS transistor according to the second embodiment is shown in FIG. 2.

In the above described first embodiment, detailed conditions are shown concerning the angle of the field plate. In the second embodiment, the structure of a field plate from which the same effect can be gained, microscopically, is proposed.

Referring to FIG. 2, L tan $\phi$ is the distance Ly of the top of the SiO$_2$ 7 from the surface of the substrate. L tan $\theta1$ is the distance Lx of the bottom of the SiO$_2$ 7 from the surface of the substrate.

Accordingly, even in the case that the angle of the edge part of the field oxide film 7 does not, by a small error, satisfy the numerical formula as shown in the first embodiment, a part of the field plate 6$f$, which extends in the horizontal direction, can be formed in the position wherein other parts of the field plate surface satisfy the above relationships so as to be able to expect the same effect as that of the first embodiment.

In the case that the L is standardized as 1, the depth x of the Si surface becomes x=tan $\theta1$ and the depth y to the field plate becomes y=tan $\phi$.

The value of y is gained as:

$$y = \tan \phi = x(1-\alpha)/(1+\alpha x^2)$$

And to gain electric field relaxation effect corresponds to setting y at the value larger than this. Accordingly, the condition corresponds to satisfy:

$$y \geq x(1-\alpha)/(1+\alpha x^2)$$

wherein the field plate form ratio is 1:x:y when L is assumed to be 1.

As an example, calculation is carried out when $\theta 1=60°$ and $\alpha=1/3$ to gain $x=\sqrt{3}$ and $y=1/\sqrt{3}$.

Figure 3:
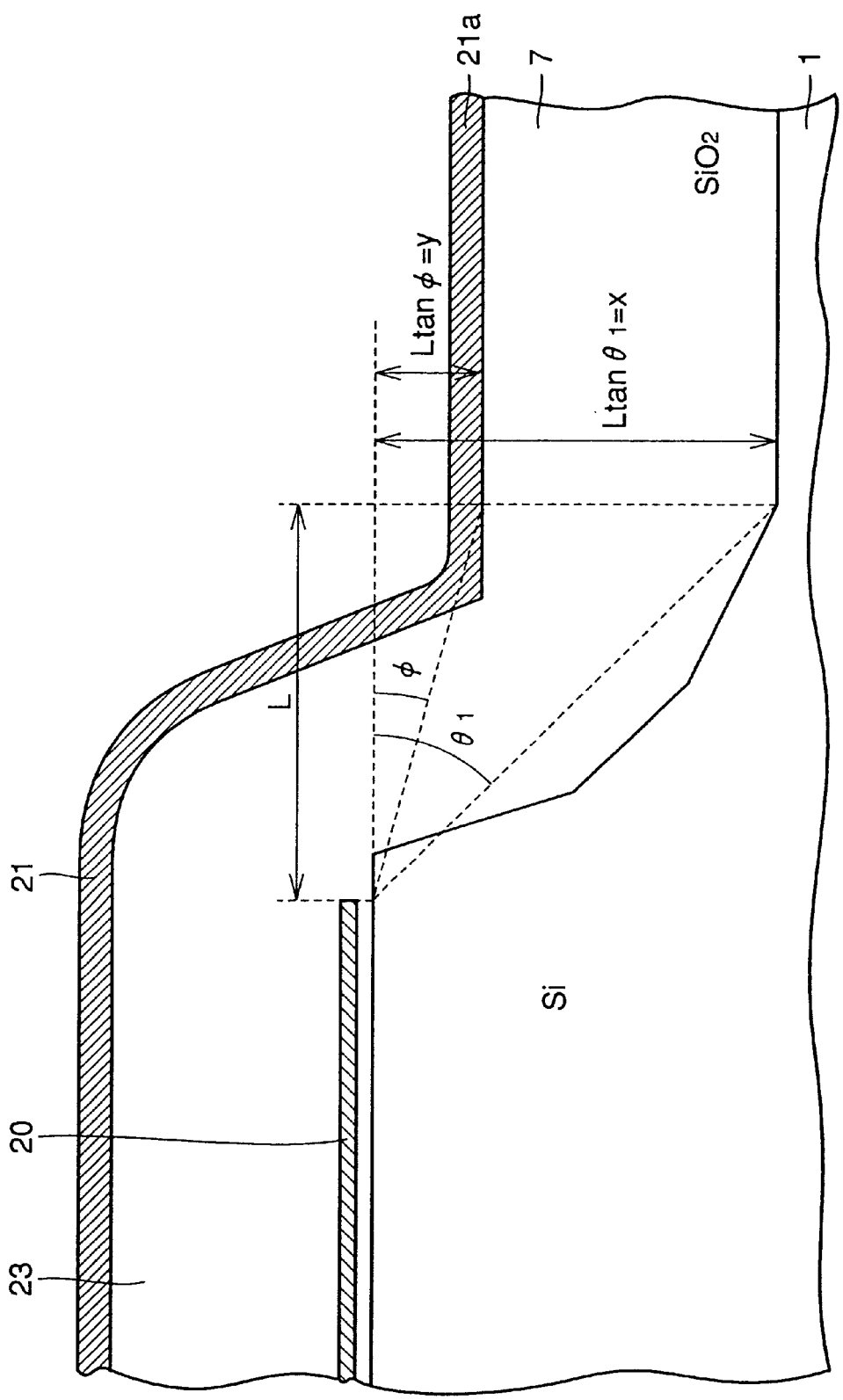
FIG. 3 is a view showing a concrete example of a semiconductor device according to the second embodiment.

A typical structure of the present embodiment utilizing poly-silicon and aluminum is shown in FIG. 3.

Referring to FIG. 3, a part of the surface of the substrate 1 is indented. An oxide film 7 is provided on the indented part in the surface of the substrate 1. A first field plate 20 is provided on the surface of the substrate 1. A second field plate 21, which has a part 21a extending in the horizontal direction, is provided on the oxide film 7. Other parts of the second field plate 21, except for the horizontal direction part 21a, are overlapped on the first field plate 20 by interposing an interlayer insulating film 23. By adjusting the thickness of the interlayer insulating film 23, a structure which satisfies the above inequality relationship in the second embodiment can be implemented.

Third Embodiment

The third embodiment relates to a method for forming a field plate of a DMOS transistor according to the present invention.

Figure 4:
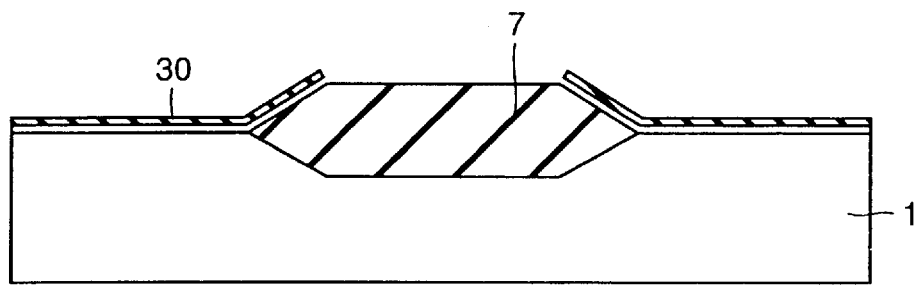
FIG. 4 is a cross section view of a semiconductor device in the first step in the sequence of a process for a semiconductor device according to a third embodiment.

Referring to FIG. 4, a field oxide film 7 is formed on the surface of a silicon substrate 1 by using a SiN cover 30 to carry out a LOCOS oxidization.

Figure 5:
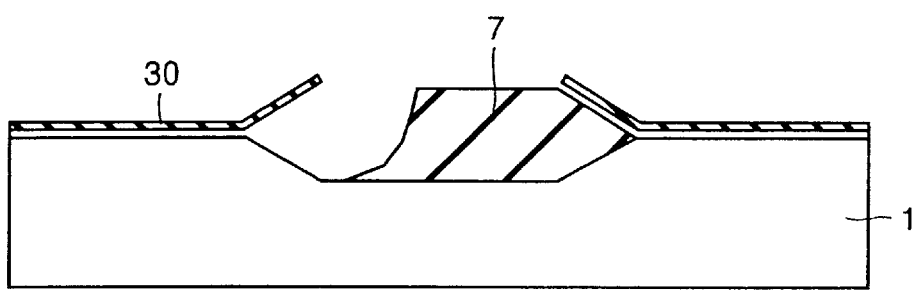
FIG. 5 is a cross section view of a semiconductor device in the second step in the sequence of a process for a semiconductor device according to the third embodiment.

Referring to FIG. 5, only the edge parts of the field oxide film 7 are etched and parts of edge parts of the field oxide film 7 are shaved off so that a part of the surface of the substrate 1 is exposed. This is carried out by using a mask which has an aperture part in a predetermined part and by selectively wet etching parts of the edge parts of the field oxide film 7 with an HF solution.

Figure 6:
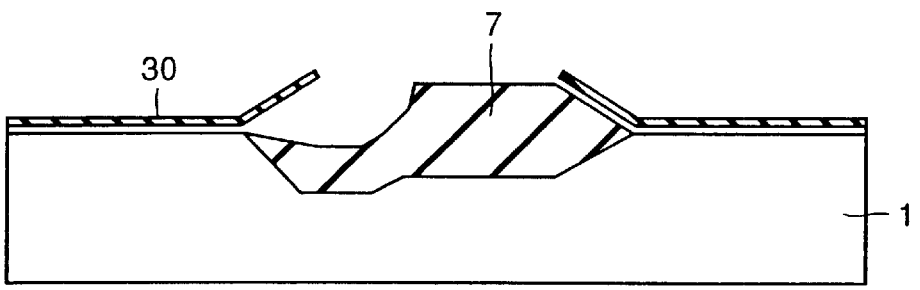
FIG. 6 is a cross section view of a semiconductor device in the third step in the sequence of a process for a semiconductor device according to the third embodiment.

Referring to FIG. 6, the exposed part of the surface of the substrate 1 is again oxidized. This can be implemented through a dry oxidization of the exposed surface while allowing O2 to flow or through a wet oxidization of the exposed surface with the added H2O.

Next, the SiN cover 30 is removed. A field plate 6f is formed on the substrate so as to cover the part again oxidized of the field oxide film 7. Through this method the field plate which has been formed on the edge part of the field oxide film can be made to be in a shape according to the present invention.

Figure 7:
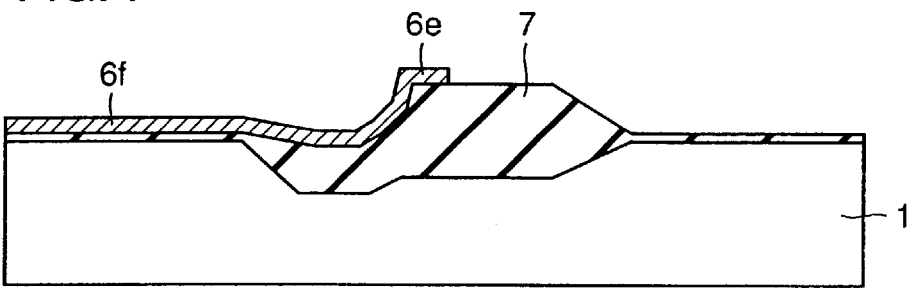
FIG. 7 is a cross section view of a semiconductor device in the fourth step in the sequence of a process for a semiconductor device according to the third embodiment.

Here, in FIG. 7, though an example where the edge part 6e of the gate reaches to the top of the field oxide film is shown, the edge part 6e of the gate may be stopped at the etched part of the field oxide film 7 in the case that the field plate 6f is desired to be made smaller.

The embodiments disclosed herein should be considered to be exemplary from all points of view and not to be limitative. The scope of the present invention is not defined by the above description but is defined by the claims and is intended to include the equivalents of the claims and all the modifications within the scope.

As described above, in accordance with a semiconductor device according to this invention, a field plate which eliminates the electric field concentration at step parts and which can gain higher withstanding voltage can be implemented.

In a process for a semiconductor device according to another aspect of this invention, effects are exercised such that a semiconductor device which has a field plate can be gained wherein the electric field concentration at the step parts can be eliminated and a higher withstanding voltage can be gained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including:
   a substrate having an upper surface and an indented portion;
   an oxide film formed in the indented portion of the substrate and having an edge part sloping downwardly toward the indented portion;
   a field plate provided over the substrate, wherein said field plate has a step part over the edge part of the oxide film that slopes downwardly from the upper surface of said substrate toward the indented portion.

2. A semiconductor device including:
   a substrate; and
   a field plate provided on the above substrate,
   wherein said field plate has a step part which bends downward from the surface of said substrate to the downward direction, wherein:
   an indent part of which the side walls are sloped is provided in the surface of said substrate;
   an oxide film of which the parts of the edge parts are slopes facing downward in the indented part of said substrate;
   said step part of said field plate is provided so as to cover said slopes of said oxide film; and
   said field plate bends toward downward direction with the bending angle $\phi$ which satisfies the following inequity at said step part:

$$\tan \phi > x(1-\alpha)/(1+\alpha x^2)$$

wherein $x=\tan \theta 1$, $\alpha$=specific dielectric constant of said oxide film/specific dielectric constant of said substrate and $\theta 1$ is an angle formed between said slope of said indented part and the surface of said substrate.

3. The semiconductor device according to claim 2 wherein said substrate is an Si substrate and said oxide film is $SiO_2$.

4. A semiconductor device including:
   a substrate of which a part of the surface is indented;
   an oxide film provided in said indented part of the surface of said substrate;
   a first field plate provided on said substrate; and
   a second field plate which is provided on said oxide film and which has a part which extends in the horizontal direction,
   wherein the following inequity is achieved when the distance in the horizontal direction between said first field plate and the part which extends in said horizontal direction of said second field plate is assumed to be 1, the depth of the bottom of said oxide film from the surface of said substrate is assumed to be x, and the depth of the part which extends in the horizontal direction of said second field plate is denoted as y:

$$y \geq x(1-\alpha)/(1+\alpha x^2)$$

in the above expression, $\alpha$=specific dielectric constant of said oxide film/specific dielectric constant of said substrate.

5. The semiconductor device according to claim 4, wherein said substrate is formed of Si and said oxide film is formed of $SiO_2$.

6. The semiconductor device according to claim 4, wherein other parts of said second field plate is overlapped on said first plate field by interposing an interlayer insulating film.

7. The semiconductor device according to claim 4, wherein said first field plate and said second field plate are integrated.

8. The process for a semiconductor device including:

the first step of forming a field oxide film on a surface of a substrate through a LOCOS method;

the second step of shaving off part of the edge parts of said field oxide film so that part of the surface of said substrate is exposed;

the third step of oxidizing again the part of the surface of said substrate which has been exposed in said second step; and the fourth step of forming a field plate on said substrate so as to cover the part again oxidized of said field oxide film.

9. The process for a semiconductor device according to claim 8 wherein said process is applied in a process for a double diffused MOS transistor.

* * * * *